(12) United States Patent
Yoshida

(10) Patent No.: US 9,362,425 B2
(45) Date of Patent: Jun. 7, 2016

(54) SOLAR CELL DEVICE AND METHOD FOR MANUFACTURING THE SAME

(71) Applicant: KYOCERA Corporation, Kyoto-shi, Kyoto (JP)

(72) Inventor: Takanobu Yoshida, Higashiomi (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 14/396,614

(22) PCT Filed: Apr. 26, 2013

(86) PCT No.: PCT/JP2013/062484
§ 371 (c)(1),
(2) Date: Oct. 23, 2014

(87) PCT Pub. No.: WO2013/162024
PCT Pub. Date: Oct. 31, 2013

(65) Prior Publication Data
US 2015/0096611 A1     Apr. 9, 2015

(30) Foreign Application Priority Data
Apr. 26, 2012 (JP) ................. 2012-101724

(51) Int. Cl.
*H01L 31/00* (2006.01)
*H01L 31/0224* (2006.01)
*H01L 31/05* (2014.01)
*H01L 31/18* (2006.01)

(52) U.S. Cl.
CPC ...... *H01L 31/022433* (2013.01); *H01L 31/022425* (2013.01); *H01L 31/0504* (2013.01); *H01L 31/182* (2013.01); *H01L 31/1804* (2013.01); *H01L 31/1864* (2013.01); *Y02E 10/50* (2013.01)

(58) Field of Classification Search
None
See application file for complete search history.

(56) References Cited

U.S. PATENT DOCUMENTS

| | | | | |
|---|---|---|---|---|
| 2010/0096014 A1* | 4/2010 | Iida | .................... | H01B 1/16 136/265 |
| 2011/0308601 A1* | 12/2011 | Kim | ................ | H01L 31/022425 136/256 |
| 2012/0048372 A1* | 3/2012 | Kim | .................. | H01L 31/02167 136/258 |

FOREIGN PATENT DOCUMENTS

| | | |
|---|---|---|
| JP | 2004-095826 A | 3/2004 |
| JP | 2005-191107 A | 7/2005 |
| JP | 2006-302890 A | 11/2006 |
| JP | 2007-214372 A | 8/2007 |
| JP | 2008-135565 A | 6/2008 |

OTHER PUBLICATIONS

International Search Report (Form PCT/ISA/210) dated Jul. 16, 2013 issued for PCT/JP2013/062484.

* cited by examiner

*Primary Examiner* — Eli Mekhlin
(74) *Attorney, Agent, or Firm* — Procopio, Cory, Hargreaves & Savitch LLP

(57) ABSTRACT

In order to provide a solar cell device having increased reliability, the present invention is provided with: a substrate having a semiconductor region containing silicon at one primary surface side; a first electrode provided on the one primary surface and containing silver as the primary component; and a second electrode connected to the first electrode on the one primary surface and containing aluminum as the primary component. The first electrode is a solar cell device containing elemental tin.

4 Claims, 7 Drawing Sheets

SOLAR CELL DEVICE AND METHOD FOR MANUFACTURING THE SAME

TECHNICAL FIELD

The present invention relates to solar cell devices and methods for manufacturing solar cell devices.

BACKGROUND ART

In a solar cell device including a silicon substrate, a first electrode containing a major proportion of silver and a second electrode containing a major proportion of aluminum are formed on one main surface thereof, i.e., the back surface. The second electrode is connected to the first electrode such that portions of the second electrode overlap the first electrode. In these overlapping portions, silicon readily forms an alloy with silver and aluminum. If some silicon is alloyed, voids occur in portions of the silicon substrate, and the silicon substrate is fragile near the voids. The silicon substrate, which has become thinner recently, readily cracks from these fragile portions. To solve this problem, for example, there is a need for the optimization of the electrode pattern of the first electrode in order to control the overlapping regions of the first and second electrodes (see, for example, Japanese Unexamined Patent Application Publication No. 10-144943).

SUMMARY OF INVENTION

Technical Problem

Unfortunately, it may be difficult to reduce cracking of the silicon substrate, depending on the factors such as the thermal history applied during the formation of the electrodes and variations in the presence of the overlapping regions. Accordingly, it is desirable to provide a solar cell device with a reduced risk of cracking of a silicon substrate and a method for manufacturing such a solar cell device.

Solution to Problem

A solar cell device according to an embodiment of the present invention includes a substrate including a semiconductor region containing silicon in a main surface thereof, a first electrode containing a major proportion of silver on the main surface, and a second electrode connected to the first electrode on the main surface and containing a major proportion of aluminum. The first electrode contains elemental tin.

A method for manufacturing a solar cell device according to an embodiment of the present invention includes the steps of providing a substrate including a semiconductor region containing silicon in a main surface thereof, applying a first metal paste containing a major proportion of silver and a minor proportion of elemental tin to the main surface, applying a second metal paste containing a major proportion of aluminum to the main surface such that the second metal paste contacts the first metal paste on the main surface, firing the first metal paste, and firing the second metal paste.

Advantageous Effects of Invention

The above solar cell device and method for manufacturing a solar cell device allow for a reduced risk of cracking of the silicon substrate. Thus, a reliable solar cell device can be provided.

BRIEF DESCRIPTION OF DRAWINGS

FIG. 7 are a pair of schematic views illustrating an example solar cell module according to the embodiment of the present invention, where

DESCRIPTION OF EMBODIMENTS

Figure 3:
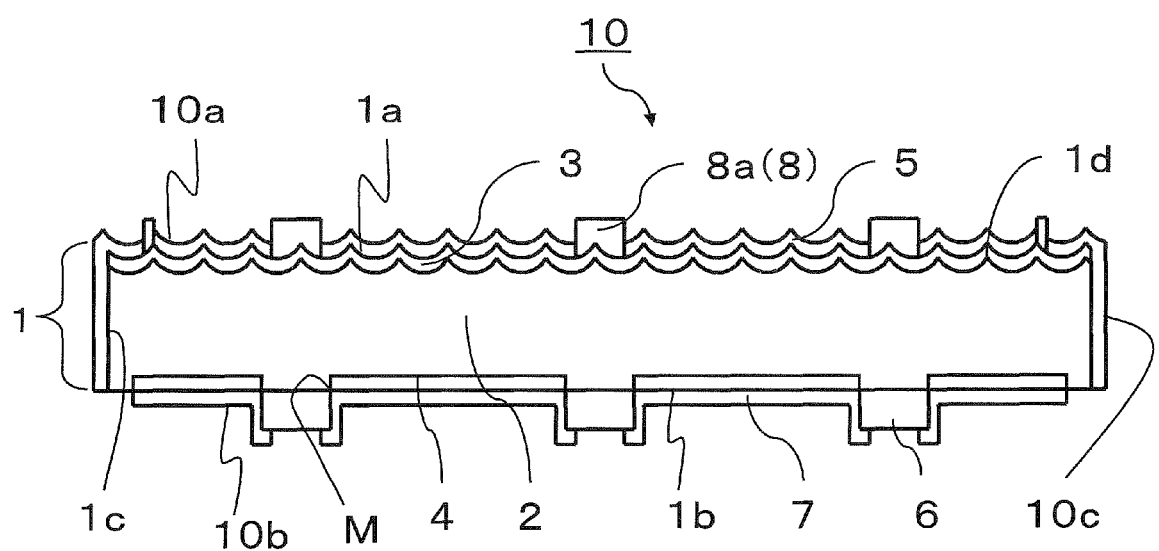
FIG. 3 is a schematic view of the example solar cell device according to the embodiment of the present invention, showing a sectional view taken along line A-A in FIG. 1.
Figure 6:
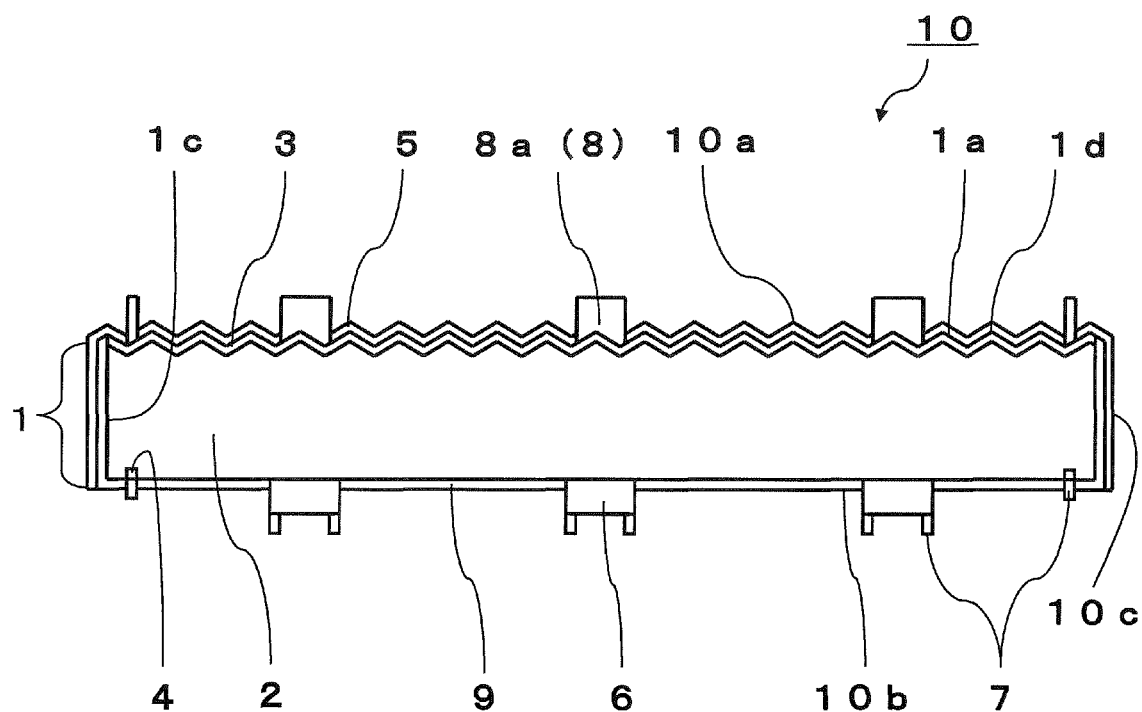
FIG. 6 is a schematic view of the example solar cell device according to the embodiment of the present invention, showing a sectional view taken along line B-B in FIG. 4.

A solar cell device, a method for manufacturing a solar cell device, and a solar cell module according to an embodiment of the present invention will now be described in detail with reference to the drawings. It should be noted that the drawings are schematic only, and the size, position, and other details of the elements in the drawings can be changed as desired. In FIGS. 3 and 6, which are sectional views, hatching for indicating the cross sections of the elements is omitted.

<Structure of Solar Cell Device>

Figure 1:
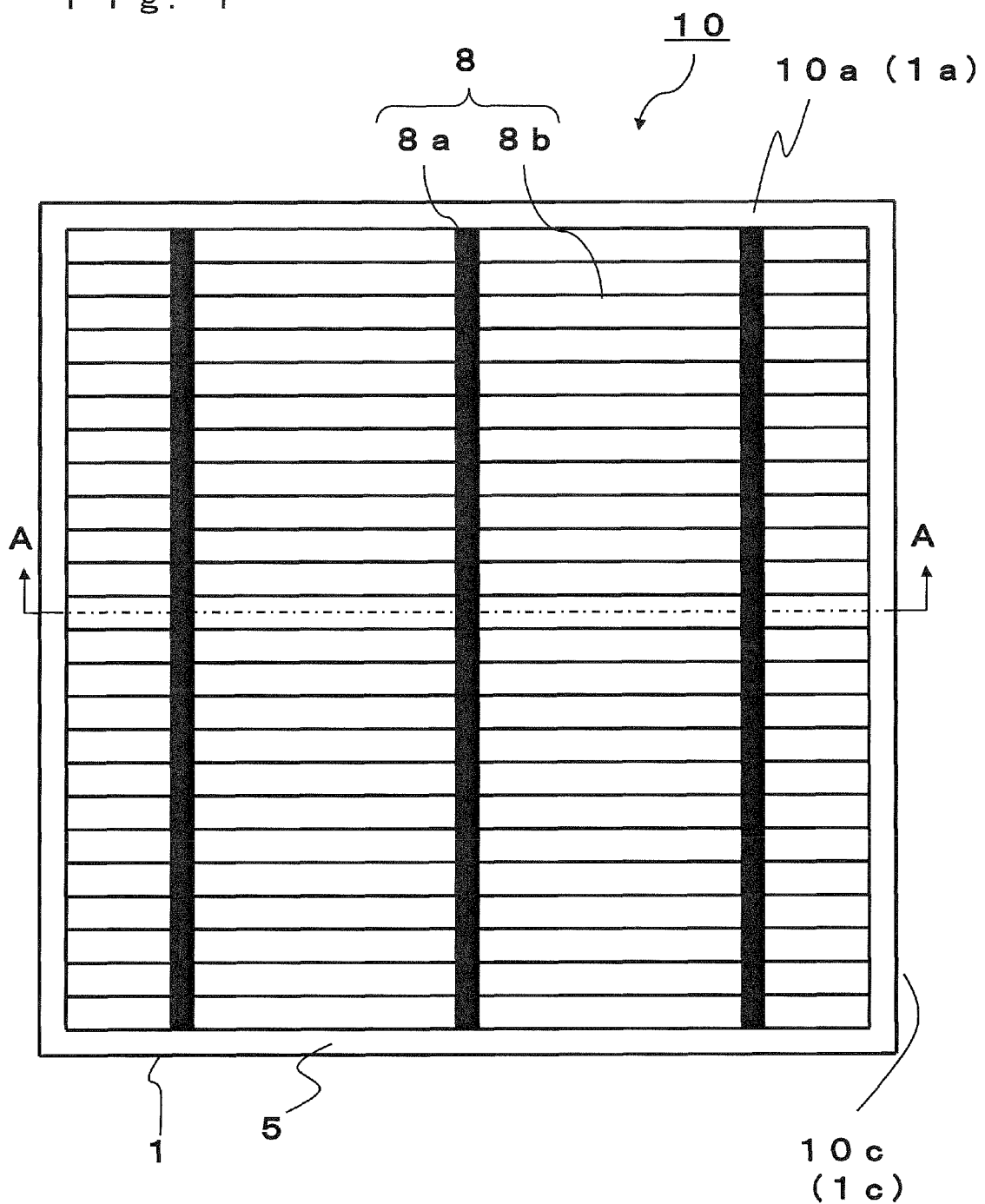
FIG. 1 is a schematic plan view of an example solar cell device according to an embodiment of the present invention as viewed from a first main surface thereof.
Figure 2:
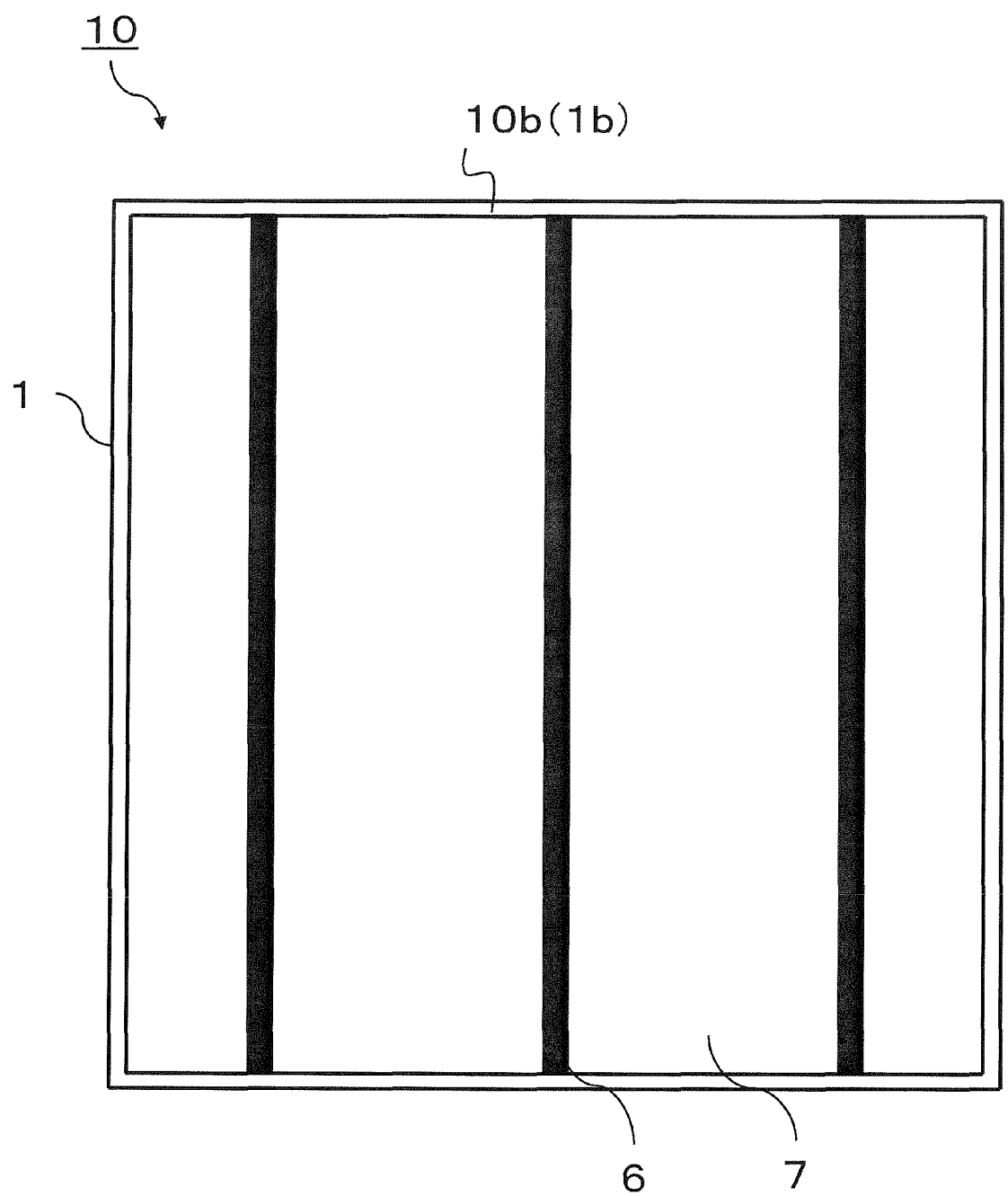
FIG. 2 is a schematic plan view of the example solar cell device according to the embodiment of the present invention as viewed from a second main surface thereof.

As shown in FIGS. 1 to 3, a solar cell device 10 according to this embodiment has a light-receiving surface (the top surface in FIG. 3, hereinafter referred to as "first main surface") 10a through which light enters the solar cell device 10, a back surface (the bottom surface in FIG. 3, hereinafter referred to as "second main surface") 10b opposite the first main surface 10a, and side surfaces 10c. The solar cell device 10 includes a silicon substrate 1 having a first main surface 1a, a second main surface 1b, and side surfaces 1c. As shown in FIG. 3, the silicon substrate 1 includes, for example, a semiconductor region of one conductivity type, i.e., a first semiconductor layer (p-type semiconductor region) 2, and a semiconductor region of the opposite conductivity type, i.e., a second semiconductor layer (n-type semiconductor region) 3, on the side of the first semiconductor layer 2 facing the first main surface 10a. As shown in FIG. 3, the solar cell device 10 also includes a third semiconductor layer 4, an antireflection layer 5, first electrodes 6, a second electrode 7, and a third electrode 8.

The silicon substrate 1 is, for example, a monocrystalline or polycrystalline silicon substrate including the first semiconductor layer 2 and the second semiconductor layer 3 on the side of the first semiconductor layer 2 facing the first main surface 1a. In this embodiment, the silicon substrate 1 may be replaced by a substrate including the first semiconductor layer 2 and the second semiconductor layer 3 as described above.

As described above, the first semiconductor layer 2 may be a p-type plate-shaped semiconductor. The semiconductor that forms the first semiconductor layer 2 is, for example, a polycrystalline silicon substrate. The first semiconductor layer 2 may have an average thickness of, for example, 250 µm or less, particularly 150 µm or less. The first semiconductor layer 2 may be, but not necessarily, rectangular in plan view for reasons of manufacture. For a polycrystalline silicon substrate, the first semiconductor layer 2 may be doped to p-type using a dopant element such as boron or gallium.

The second semiconductor layer 3 is a semiconductor layer on the first semiconductor layer 2. The second semiconductor layer 3 forms a p-n junction with the first semiconductor layer 2. The second semiconductor layer 3 is a semiconductor layer of the opposite conductivity type to the first semiconductor layer 2, i.e., an n-type semiconductor layer, and is disposed on the side of the first semiconductor layer 2 facing the first main surface 1a. If the first semiconductor layer 2 is a p-type conductivity silicon substrate, the second semiconductor layer 3 can be formed, for example, by diffusing an impurity such as phosphorus into the first main surface 1a of the silicon substrate 1.

As shown in FIG. 3, the silicon substrate 1 may have a texture 1d on the first main surface 1a thereof. The projections in the texture 1d have a height of about 0.1 to 10 µm and a width of about 0.1 to 20 µm. The texture 1d may be composed of numerous pyramids, and the recesses do not have to be spherical as shown in FIG. 3.

The above height of the projections is, for example, in the sectional view in FIG. 3, the distance between a straight line passing through the bottoms of the recesses, which serves as a baseline, and the tops of the projections in the direction perpendicular to the baseline. The width of the projections is the distance between the tops of the adjacent projections in the direction parallel to the baseline.

The antireflection layer 5 is made of, for example, a silicon nitride layer or a silicon oxide layer. The thickness of the antireflection layer 5 may be selected depending on the material, and a thickness may be employed that provides reflection-free conditions for suitable incident light. For example, the antireflection layer 5 may have a refractive index of about 1.8 to 2.3 and an average thickness of about 200 to 1,200 Å.

The third semiconductor layer 4 is formed in the second main surface 1b of the silicon substrate 1 and is of the same conductivity type as the first semiconductor layer 2, i.e., p-type. The third semiconductor layer 4 has a higher dopant concentration than the first semiconductor layer 2. That is, a dopant element is present in the third semiconductor layer 4 in a higher concentration than the dopant element present in the first semiconductor layer 2 doped to one conductivity type. The third semiconductor layer 4 is intended to reduce a decrease in conversion efficiency due to the recombination of carriers near the second main surface 1b of the silicon substrate 1 and forms an internal electric field near the second main surface 1b of the silicon substrate 1. The third semiconductor layer 4 can be formed, for example, by diffusing a dopant element such as boron or aluminum into the second main surface 1b of the silicon substrate 1. The concentration of the dopant element present in the third semiconductor layer 4 may be about $1 \times 10^{18}$ to $5 \times 10^{21}$ atoms/cm$^3$. The third semiconductor layer 4 may be formed in the portion of the silicon substrate 1 in contact with the second electrode 7, described later.

As shown in FIGS. 2 and 3, the first electrodes 6 are electrodes on the second main surface 1b of the silicon substrate 1. The first electrodes 6 have a thickness of about 10 to 30 µm and a width in the lateral direction of about 1.3 to 7 mm.

The first electrodes 6 contain a major proportion of silver. The first electrodes 6 can be formed, for example, by applying a metal paste containing a major proportion of silver in the desired pattern by a process such as screen printing and then firing the metal paste. In this embodiment, the term "major proportion" refers to 50% by mass or more based on the total composition.

As shown in FIG. 3, the second electrode 7 is an electrode electrically connected to the first electrodes 6 on the second main surface 1b of the silicon substrate 1. The first electrodes 6 may be at least partially connected to the second electrode 7. The second electrode 7 has a thickness of about 15 to 50 µm and is formed over substantially the entire second main surface 1b of the silicon substrate 1 except for portions of the regions where the first electrodes 6 are formed. The second electrode 7 contains a major proportion of aluminum. The second electrode 7 can be formed, for example, by applying a metal paste containing a major proportion of aluminum in the desired pattern by a process such as screen printing and then firing the metal paste.

In this embodiment, the first electrodes 6 contain elemental tin. This reduces the risk of cracking of the silicon substrate 1 from around overlapping portions M of the first electrodes 6 and the second electrode 7. Although the reason is not fully understood, it is believed that an alloy of silver and tin forms first in the overlapping portions M and inhibits the alloying of silicon with silver and aluminum. This reduces voids that can occur in the silicon substrate 1 when the above alloy forms.

The first electrodes 6 may have extremely small through-holes, with tin deposited around the through-holes. This allows aluminum to be inserted into the through-holes to increase the contact area between the first electrodes 6 and the second electrode 7, thus improving the power characteristics of the solar cell device 10. In this case, elemental tin present near the through-holes inhibits the formation of an alloy of silicon with silver and aluminum. This reduces the risk of cracking of the silicon substrate 1.

The presence of elemental tin in the first electrodes 6 may be determined, for example, by electron probe microanalysis (EPMA). Specifically, if tin is visible as black spots in a scanning electron microscope (SEM) photograph, the presence of elemental tin can be determined by performing a compositional analysis on these spots by EPMA, for example, using a JXA-8100 available from JEOL Ltd.

For example, even if tin is not visible as black spots in an SEM photograph of the first electrodes 6, the presence of elemental tin can be estimated by performing a compositional analysis by EPMA.

Elemental tin may be present in the first electrodes 6 in an amount of 0.1 to 5 parts by mass based on 100 parts by mass of silver. If elemental tin is present within the above range, it reduces the risk of cracking of the silicon substrate 1 while the first electrodes 6 have good adhesion strength.

As shown in FIG. 3, the second electrode 7 may include portions located on the first electrodes 6. This allows the contact area between the first electrodes 6 and the silicon substrate 1 to be increased so that the first electrodes 6 have good adhesion strength. Aluminum has a lower melting point than silver; therefore, if the second electrode 7 is located on the first electrodes 6, molten aluminum readily contacts silver and silicon during the formation of the electrodes. This increases the likelihood of aluminum being alloyed with silver and silicon. However, if the first electrodes 6 contain elemental tin, it inhibits the above alloying, thus reducing the risk of cracking of the silicon substrate 1.

The second electrode 7 may have a larger average thickness than the first electrodes 6 in the direction perpendicular to the second main surface 1b, i.e., the thickness direction. This reduces the resistance loss of the second electrode 7 and thus improves the power characteristics of the solar cell device 10. Aluminum has a lower melting point than silver; therefore, if a large amount of molten aluminum is present during the formation of the electrodes, it readily contacts silver and silicon. This increases the likelihood of aluminum being alloyed with silver and silicon. However, if the first electrodes 6 contain elemental tin, it inhibits the above alloying, thus reducing the risk of cracking of the silicon substrate 1.

The third electrode 8 is an electrode on the first main surface 1a of the silicon substrate 1. As shown in FIG. 1, the third electrode 8 includes third power output electrodes 8a and a plurality of linear third collector electrodes 8b. The third power output electrodes 8a are at least partially electrically connected to the third collector electrodes 8b such that they cross each other. The third collector electrodes 8b are linear and have a width in the lateral direction of, for example, about 50 to 200 μm. The third power output electrodes 8a have a width in the lateral direction of, for example, about 1.3 to 2.5 mm. The third collector electrodes 8b have a smaller width in the lateral direction than the third power output electrodes 8a. The third collector electrodes 8b are arranged at a spacing of about 1.5 to 3 mm. The third electrode 8 has a thickness of about 10 to 40 μm. The third electrode 8 can be formed, for example, by applying a third metal paste containing a major proportion of silver in the desired pattern by a process such as screen printing and then firing the metal paste.

Figure 4:
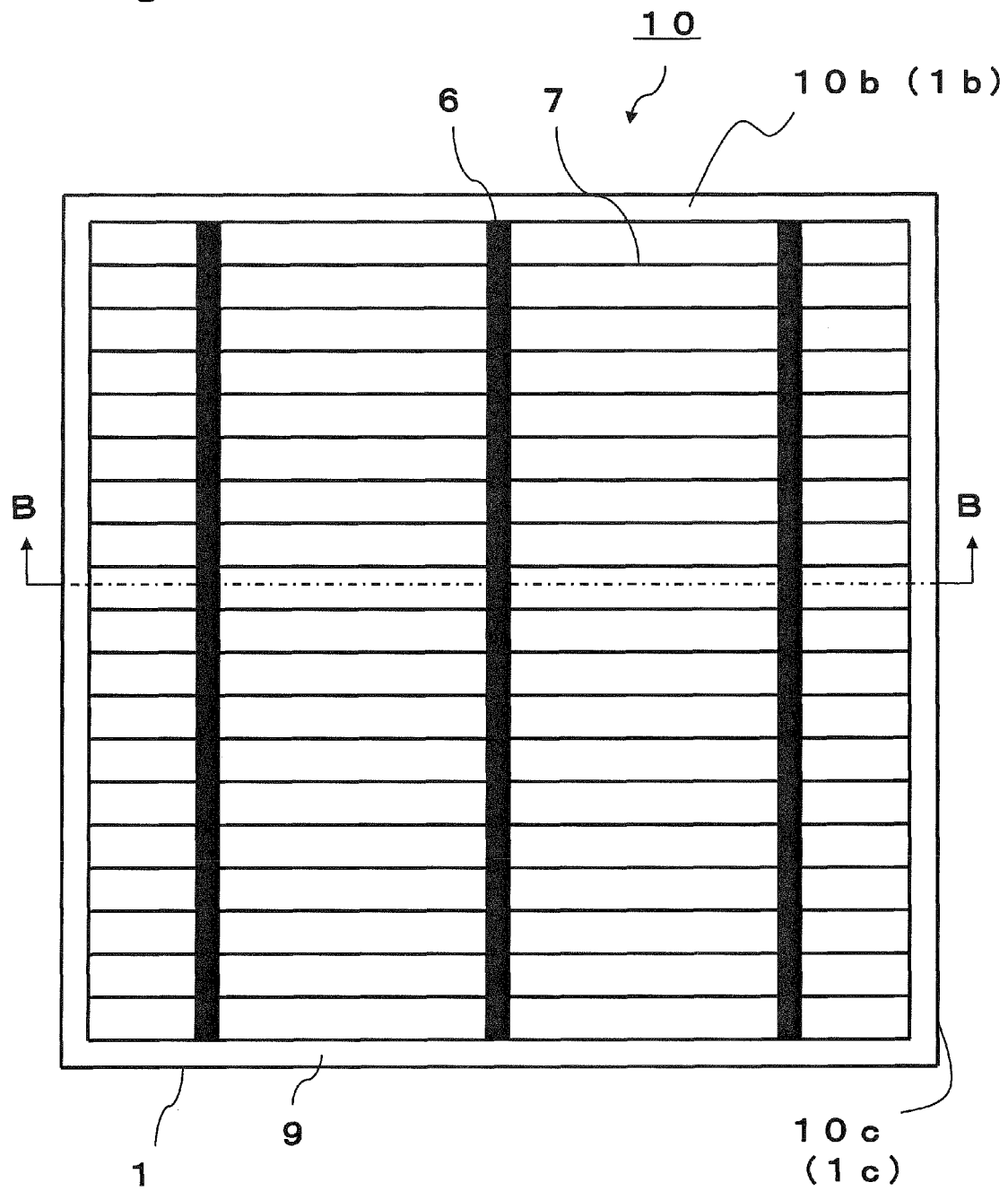
FIG. 4 is a schematic plan view of the example solar cell device according to the embodiment of the present invention as viewed from the second main surface thereof after the formation of first and second electrodes.

Although the above embodiment includes the second electrode 7 formed over substantially the entire second main surface 1b, other embodiments may be employed. As shown in FIGS. 4 and 6, the second electrode 7 may be a plurality of linear electrodes, as are the third collector electrodes 8b. In this case, the first electrodes 6 are at least partially electrically connected to the second electrodes 7 such that they cross each other. The second electrodes 7 are linear and have a width in the lateral direction of, for example, about 50 to 300 μm. The first electrodes 6 have a width in the lateral direction of, for example, about 1.3 to 3 mm. The second electrodes 7 have a smaller width in the lateral direction than the first electrodes 6. The second electrodes 7 are arranged at a spacing of about 1.5 to 3 mm. If the second electrodes 7 have a larger width in the lateral direction than the third collector electrodes 8b of the third electrode 8, the second electrodes 7 have a lower series resistance, which improves the power characteristics of the solar cell device 10.

Figure 5:
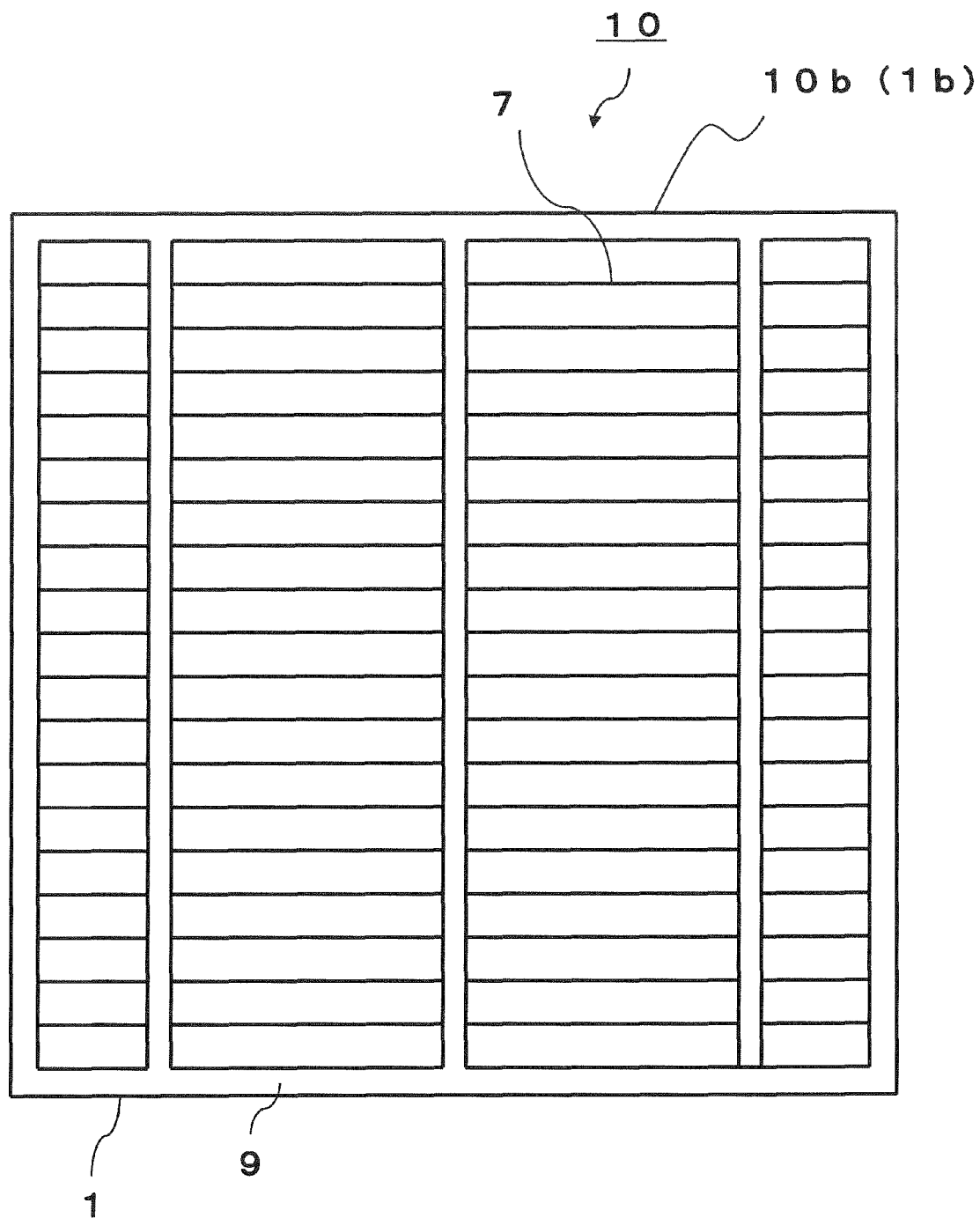
FIG. 5 is a schematic plan view of the example solar cell device according to the embodiment of the present invention as viewed from the second main surface thereof, showing only the second electrode.

As shown in FIGS. 5 and 6, the solar cell device 10 may have a structure including a passivation layer 9 made of a material such as silicon nitride or aluminum oxide on the second main surface 1b.

The passivation layer 9 is intended to reduce the recombination of minority carriers in the back surface, i.e., the second main surface 1b, and the side surfaces 1c of the silicon substrate 1. The passivation layer 9 may be a silicon-nitride-based film such as a silicon nitride ($Si_3N_4$) or amorphous silicon nitride (a-$SiN_x$) film or a film of a material such as silicon oxide ($SiO_2$), aluminum oxide ($Al_2O_3$), or titanium oxide ($TiO_2$). The passivation layer 9 may have a thickness of about 10 to 200 nm and may be formed by a process such as PECVD, evaporation, or sputtering. The passivation layer 9 improves the power characteristics of the solar cell device 10. In this embodiment, the passivation layer 9 is disposed on the second main surface 1b in the region where the second electrodes 7 are not formed. This reduces the contact resistance between the silicon substrate 1 and the second electrodes 7 and thus further improves the power characteristics of the solar cell device 10.

In the above embodiment, in which the second electrode 7 is not formed over substantially the entire surface, the solar cell device 10 may have a lower breaking strength. The solar cell device 10, however, is resistant to breakage because the elemental tin present in the first electrodes 6 reduces the risk of cracking of the silicon substrate 1.

<Method for Manufacturing Solar Cell Device>

The individual steps of a method for manufacturing the solar cell device 10 will now be described in detail.

A step of providing the silicon substrate 1 including the first semiconductor layer (p-type semiconductor region) 2 will be described first. The silicon substrate 1 is formed, for example, by the Czochralski (CZ) process or casting. The following description will be directed to an example where the silicon substrate 1 is a p-type polycrystalline silicon substrate.

An ingot of polycrystalline silicon is first prepared, for example, by casting. The ingot is then sliced to a thickness of, for example, 250 μm or less. To remove a mechanically damaged layer and contaminated layer from the cut surface of the silicon substrate 1, the surface of the silicon substrate 1 may be slightly etched with an aqueous solution such as NaOH, KOH, hydrofluoric acid, or a hydrofluoric acid/nitric acid mixture.

The texture 1d is then formed on the first main surface 1a of the silicon substrate 1. The texture 1d can be formed by a wet etching process using an alkaline solution such as NaOH or an acid solution such as a hydrofluoric acid/nitric acid mixture or by a dry etching process such as reactive ion etching (RIE).

A step of forming the second semiconductor layer (n-type semiconductor region) 3 is then performed on the first main surface 1a of the silicon substrate 1 having the texture 1d formed in the above step. Specifically, an n-type second semiconductor layer 3 is formed in the first main surface 1a of the silicon substrate 1 having the texture 1d.

The second semiconductor layer 3 is formed by a process such as coating thermal diffusion, in which a $P_2O_5$ paste is applied to the surface of the silicon substrate 1 and is thermally diffused, or vapor-phase thermal diffusion, in which gaseous phosphorus oxychloride ($POCl_3$) is used as a diffusion source. The second semiconductor layer 3 is formed such that it has a depth of about 0.2 to 2 μm and a sheet resistance of about 40 to 200 Ω/sq. For example, in vapor-phase thermal diffusion, the silicon substrate 1 is heat-treated at a temperature of about 600° C. to 800° C. in an atmosphere containing a diffusing gas such as $POCl_3$ for about 5 to 30 minutes to form phosphorus glass on the surface of the silicon substrate 1. The silicon substrate 1 is then heat-treated at an elevated temperature, i.e., about 800° C. to 900° C., in a suitable inert gas atmosphere selected from gases such as argon and nitrogen for about 10 to 40 minutes so that phosphorus diffuses from the phosphorus glass into the silicon substrate 1 to form the second semiconductor layer 3 in the first main surface 1a of the silicon substrate 1.

If the second semiconductor layer 3 is also formed in the second main surface 1b in the step of forming the second semiconductor layer 3, only the second semiconductor layer 3 is removed from the second main surface 1b by etching. As a result, the p-type conductivity region is exposed in the second main surface 1b. For example, the second semiconductor layer 3 is removed from the second main surface 1b by immersing only the second main surface 1b of the silicon substrate 1 in a hydrofluoric acid/nitric acid mixture. Thereafter, the phosphorus glass deposited to form the second semiconductor layer 3 is removed from the surface (first main surface 1a) of the silicon substrate 1 by etching.

Thus, because phosphorus glass remains on the first main surface 1a while the second semiconductor layer 3 is removed from the second main surface 1b, the phosphorus glass serves as an etch-stop layer to reduce removal of or damage to the second semiconductor layer 3 in the first main surface 1a. The second semiconductor layer 3 may also be removed from the side surfaces 1c of the silicon substrate 1.

In the step of forming the second semiconductor layer 3, a diffusion mask may be formed on the second main surface 1b in advance, and the second semiconductor layer 3 may then be formed, for example, by vapor-phase thermal diffusion, followed by the removal of the diffusion mask. This process allows the same structure to be formed. This process does not require the step of removing the second semiconductor layer 3 from the second main surface 1b because the second semiconductor layer 3 is not formed in the second main surface 1b.

In this way, a polycrystalline silicon substrate (silicon substrate) 1 can be provided that includes the p-type semiconductor layer (first semiconductor layer) 2 and the n-type second semiconductor layer 3 in the first main surface 1a thereof and that has the surface texture 1d formed thereon.

The antireflection layer 5 is then formed on the first main surface 1a of the silicon substrate 1, i.e., on the second semiconductor layer 3. The antireflection layer 5 is formed, for example, by plasma-enhanced chemical vapor deposition (PECVD), evaporation, or sputtering. For example, if an antireflection layer 5 made of silicon nitride film is formed by PECVD, a gas mixture of silane ($SiH_4$) and ammonia ($NH_3$) is diluted with nitrogen ($N_2$) and is converted into plasma and deposited by glow discharge decomposition to form the antireflection layer 5. The internal temperature of the deposition chamber during this process may be about 500° C.

A third semiconductor layer 4 in which a semiconductor impurity of one conductivity type is diffused in a high concentration is then formed in the second main surface 1b of the silicon substrate 1. The third semiconductor layer 4 can be formed, for example, by the following two methods. A first method is to form the third semiconductor layer 4 by thermal diffusion at a temperature of about 800° C. to 1,100° C. using boron tribromide ($BBr_3$) as a diffusion source. A second method is to apply an aluminum paste containing aluminum powder and other materials such as an organic vehicle by printing and then to heat (fire) the paste at a temperature of about 600° C. to 850° C. so that aluminum diffuses into the silicon substrate 1. The second method allows the desired diffusion region to be formed only in the printed surface and also eliminates the need to remove the layer of the opposite conductivity type, i.e., n-type, formed in the second main surface 1b in the step of forming the second semiconductor layer 3. Thus, after the desired diffusion region is formed by the second method, p-n isolation may be performed, for example, using a laser, only on the periphery of the first main surface 1a or the second main surface 1b.

The first electrodes 6, the second electrode 7, and the third electrode 8 are then formed as follows.

The first electrodes 6 are formed using a metal paste (hereinafter referred to as "first metal paste") containing a metal power containing a major proportion of silver and a minor proportion of elemental tin, an organic vehicle, and glass frit. The first metal paste can be applied, for example, by screen printing. After the paste is applied, it may be dried at a predetermined temperature to evaporate the solvent. The silicon substrate 1 having the first metal paste applied thereto is fired in a firing furnace at a maximum temperature of 600° C. to 850° C. for several tens of seconds to several tens of minutes to form the first electrodes 6 on the second main surface 1b of the silicon substrate 1.

The second electrode 7 is formed using a metal paste (hereinafter referred to as "second metal paste") containing a metal power containing a major proportion of aluminum, an organic vehicle, and glass frit. The second metal paste is applied to the second main surface 1b such that it contacts part of the first metal paste applied in advance. The second metal paste may be applied over substantially the entire second main surface 1b except for portions of the regions where the first electrodes 6 are formed. The second metal paste can be applied, for example, by screen printing. After the paste is applied, it may be dried at a predetermined temperature to evaporate the solvent. The silicon substrate 1 having the second metal paste applied thereto is fired in a firing furnace at a maximum temperature of 600° C. to 850° C. for several tens of seconds to several tens of minutes to form the second electrode 7 on the second main surface 1b of the silicon substrate 1. The second metal paste may be used to simultaneously form the third semiconductor layer 4 and the second electrode 7.

The third electrode 8 is formed, for example, using a metal paste (hereinafter referred to as "third metal paste") containing a metal power containing, for example, a major proportion of silver (Ag), an organic vehicle, and glass frit. The third metal paste is applied to the first main surface 1a of the silicon substrate 1 and is then fired in a firing furnace at a maximum temperature of 600° C. to 800° C. for several tens of seconds to several tens of minutes to form the third electrode 8. The third metal paste can be applied, for example, by screen printing. After the paste is applied, it may be dried at a predetermined temperature to evaporate the solvent. The third electrode 8 includes the third power output electrodes 8a and the third collector electrodes 8b, which can be formed in a single step by screen printing.

In this way, the solar cell device 10 can be fabricated. In this embodiment, the first electrodes 6 are formed using a first metal paste containing a metal power containing a major proportion of silver and a minor proportion of elemental tin. This reduces the risk of cracking of the silicon substrate 1 from around the overlapping portions M of the first electrodes 6 and the second electrode 7. If the second metal paste contains elemental tin, it tends to adversely affect the third semiconductor layer 4, which is formed simultaneously with the second electrode 7, and may thus decrease the power characteristics of the solar cell device 10.

The first metal paste contains elemental tin, an organic vehicle, and glass frit in amounts of 0.1 to 5 parts by mass, 10 to 30 parts by mass, and 0.1 to 10 parts by mass, respectively, based on 100 parts by mass of silver. If elemental tin is present within the above range, the resulting first electrodes 6 have good adhesion strength.

If elemental tin is present in the first metal paste as particles having an average particle size of 1 to 20 µm, it exhibits high dispersibility in the first metal paste. This allows elemental tin to be substantially evenly present in the first electrodes 6 and therefore efficiently inhibits the alloying of the three metals, i.e., silicon, silver, and aluminum, near the overlapping portions M of the first electrodes 6 and the second electrode 7, thus reducing the risk of cracking of the silicon substrate 1.

If the passivation layer 9 is provided on the second main surface 1b of the silicon substrate 1, it may be formed on the second main surface 1b of the silicon substrate 1, for example, by PECVD, evaporation, or sputtering, before the first and second metal pastes are applied thereto. The second metal paste may then be directly applied to the passivation layer 9 in a predetermined region, and a fire-through process may be performed by heat treatment at an elevated temperature, i.e., a maximum temperature of 600° C. to 800° C. In this fire-through process, the components of the applied second metal paste penetrate the passivation layer 9 to form the third semiconductor layer 4 in the second main surface 1b of the silicon substrate 1, while the second electrode 7 is formed thereon. For example, as shown in FIG. 5, the second electrode 7 may be formed such that it covers regions of the second main surface 1b where portions of the first electrodes 6 are formed. The first electrodes 6 may be formed before the second electrode 7 is formed. The first electrodes 6 need not be in direct contact with the silicon substrate 1; the passivation layer 9 may be present between the first electrodes 6 and the silicon substrate 1.

The first electrodes 6 and the second electrode 7 may be formed by applying and then simultaneously firing the individual metal pastes. This improves the productivity and also reduces the thermal history applied to the silicon substrate 1 to improve the power characteristics of the solar cell device 10. Although simultaneous firing tends to promote the alloying of the three metals, i.e., silicon, silver, and aluminum, the elemental tin present in the first metal paste inhibits the alloying. This reduces the risk of cracking of the silicon substrate 1.

The present invention is not limited to the above embodiment, but various changes and modifications can be made.

For example, the silicon substrate 1 may be cleaned before the passivation layer 9 is formed thereon. The cleaning step may be performed by a cleaning method such as, for example, hydrofluoric acid treatment, RCA cleaning (a cleaning method developed by RCA Corporation, U.S., which uses cleaning solutions such as high-temperature concentrated sulfuric acid/hydrogen peroxide/water, dilute hydrofluoric acid (at room temperature), ammonia/hydrogen peroxide/water, and hydrochloric acid/hydrogen peroxide/water) followed by hydrofluoric acid treatment, or SPM (sulfuric acid/hydrogen peroxide/water mixture) cleaning followed by hydrofluoric acid treatment.

The silicon substrate 1 may be annealed in a hydrogen-containing gas in any step after the step of forming the passivation layer 9 to further decrease the recombination rate of minority carriers in the silicon substrate 1.

The solar cell device 10 may be, for example, a back-contact solar cell device having a metal-wrap-through structure in which part of the third electrode 8 is located on the second main surface 1b.

<Solar Cell Module>

A solar cell module 20 according to this embodiment will now be described in detail with reference to FIGS. 7A and 7B. The solar cell module 20 includes one or more solar cell devices 10 according to this embodiment described above. Specifically, the solar cell module 20 includes a plurality of solar cell devices 10 electrically connected together.

For example, if a single solar cell device 10 has low electrical power, a plurality of solar cell devices 10 are connected in series and in parallel to form the solar cell module 20. A plurality of solar cell modules 20 can be combined together to output a practical electrical power.

Figure 7A:
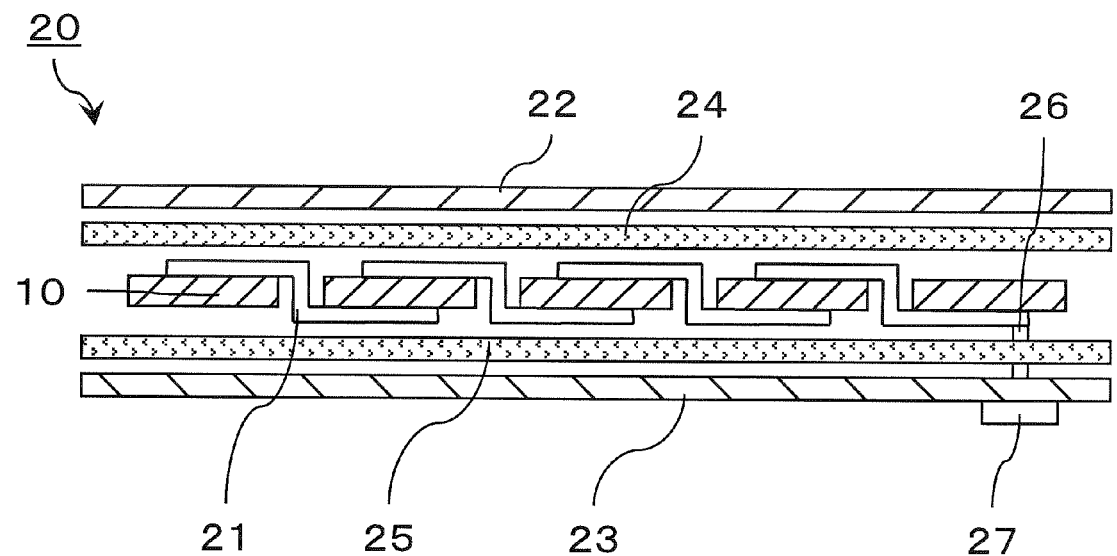
FIG. 7A is a partial enlarged sectional view of the solar cell module.
Figure 7B:
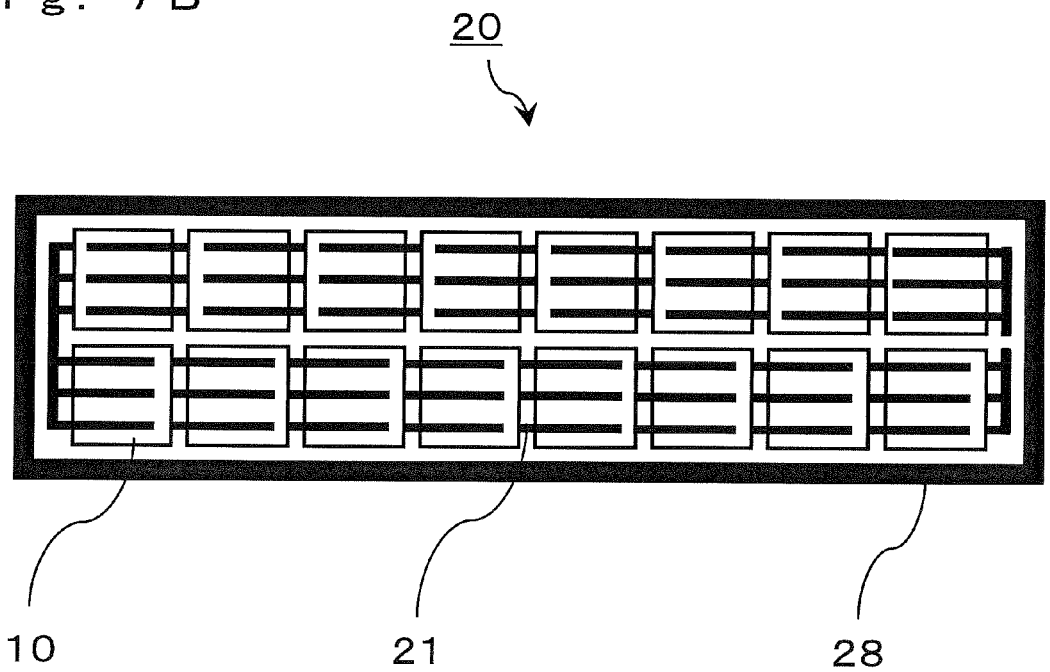
FIG. 7B is a plan view of the solar cell module as viewed from a first main surface thereof.

As shown in FIG. 7A, the solar cell module 20 generally includes, for example, a transparent member 22 such as glass, a transparent front filler 24 such as ethylene-vinyl acetate copolymer resin (EVA) or ethylene-α-olefin copolymer, a plurality of solar cell devices 10, wiring members 21 that connect together the solar cell devices 10, a back filler 25 such as EVA or ethylene-α-olefin copolymer, and a single-layer or laminated back protector 23 made of a material such as polyethylene terephthalate (PET) or polyvinyl fluoride resin (PVF).

The adjacent solar cell devices 10 are electrically connected in series to each other such that the first electrodes 6 of one solar cell device 10 are connected to the third electrode 8 of another solar cell device 10 via the wiring members 21.

The wiring members 21 may be, for example, copper foils having a thickness of about 0.1 to 0.2 mm and a width of about 2 mm and coated with a solder material in their entirety.

Of the series-connected solar cell devices 10, an end of the first solar cell device 10 and an end of an electrode of the last solar cell device 10 are each connected to a terminal box 27, which serves as a power output unit, via a power output line 26. Although not illustrated in FIG. 7A, the solar cell module 20 may include, as shown in FIG. 7B, a frame 28 made of a material such as aluminum.

The use of a white back filler 25 in the solar cell module 20 provides a high-performance back reflection structure.

Although some embodiments of the present invention have been illustrated above, the present invention is not limited to the above embodiments; it should be understood that any modification may be made without departing from the spirit of the present invention.

EXAMPLES

Specific examples of the above embodiments will now be described. A plurality of polycrystalline silicon substrates 156 mm square and about 200 μm thick were first provided as the silicon substrate 1. These polycrystalline silicon substrates were doped to p-type conductivity with boron in advance.

Each of the polycrystalline silicon substrates was subjected to RIE to form the texture 1d as shown in FIG. 3 on the first main surface 1a thereof.

Phosphorus atoms were then diffused into the surfaces of the substrate 1 to form an n-type second semiconductor layer 3 having a sheet resistance of about 90 Ω/sq. The second semiconductor layer 3 was removed from the side surfaces 1c and the second main surface 1b with a hydrofluoric acid/nitric acid mixture, and phosphorus glass was then removed from the second semiconductor layer 3 with hydrofluoric acid.

A passivation layer 9 made of an aluminum oxide layer was then formed on the second main surface 1b of the silicon substrate 1 by atomic layer deposition (ALD). An antireflection layer 5 made of a silicon nitride layer was formed on the first main surface 1a of the silicon substrate 1 by plasma-enhanced CVD.

A third metal paste containing a major proportion of silver was then applied to the first main surface 1a in the linear pattern as shown in FIG. 1. A first metal paste containing a major proportion of silver was applied to the second main surface 1b in the pattern of the first electrodes 6 as shown in FIG. 4. A second metal paste containing a major proportion of aluminum was applied to the second main surface 1b in the pattern of the second electrode 7 as shown in FIG. 5. Thereafter, these paste patterns were fired to form the third semiconductor layer 4, the first electrodes 6, the second electrode 7, and the third electrode 8 as shown in FIG. 6. The second electrode 7 and the third electrode 8 were connected to the silicon substrate 1 by performing a fire-through process on the second and third metal pastes. In this way, solar cell devices 10 were fabricated.

As an example of the present invention, a solar cell device was fabricated using a first metal paste containing a minor proportion of elemental tin. As comparative examples, solar cell devices were fabricated using a metal paste containing no minor additional component (Comparative Example 1), a metal paste containing a minor proportion of tin oxide (Comparative Example 2), and a metal paste containing a minor proportion of tin-zinc alloy (Comparative Example 3). In the examples other than Comparative Example 1, the minor component was present in the first metal paste as particles having an average particle size of 5 μm in an amount of 3 parts by mass based on 100 parts by mass of silver.

The breaking strength of the solar cell devices of the Example and Comparative Examples 1 to 3 was measured by a four-point bending test. In addition, the first electrodes 6 were removed, and the frequency of voids that occurred in the surface of the silicon substrate 1 was evaluated. The measurement results are shown in Table 1.

TABLE 1

| | Minor component | Breaking strength (N) | Frequency of voids |
|---|---|---|---|
| Example | Tin | 8 | Low |
| Comparative Example 1 | None | 3 | High |
| Comparative Example 2 | Tin oxide | 3 | High |
| Comparative Example 3 | Tin-Zinc | 3 | High |

The results demonstrated that the breaking strength was higher in the Example than in Comparative Examples 1 to 3. The results also demonstrated that significantly fewer voids occurred in the silicon substrate 1 in the Example than in Comparative Examples 1 to 3.

Additionally, first metal pastes containing elemental tin in an amount of 0.05, 0.1, 1, 5, or 7 parts by mass based on 100 parts by mass of silver were used in the Example to measure the breaking strength by a four-point bending test and the adhesion strength of the electrodes. The adhesion strength was determined by bonding wiring members made of solder-coated copper foils to the first electrodes 6, measuring the strength at which the first electrodes 6 detached from the silicon substrate 1 when the copper foils were pulled at six points, and averaging the measurements. The measurement results are shown in Table 2. The content of elemental tin in the first electrodes 6 after the formation of the first electrodes 6 was determined by performing a compositional analysis by EPMA using a JXA-8100 available from JEOL Ltd. As a result, the content of elemental tin in the first electrodes 6 was substantially equal to the content of elemental tin in the metal pastes within the limits of analytical error.

TABLE 2

| Tin content (parts by mass) | Breaking strength (N) | Adhesion strength (N) |
|---|---|---|
| 0.01 | 4 | 2.9 |
| 0.1 | 5 | 2.9 |
| 1 | 8 | 2.7 |
| 3 | 8 | 2.5 |
| 5 | 8 | 2.2 |
| 7 | 8 | 1.9 |

As shown in Table 2, the results demonstrated that the use of a first metal paste containing tin in an amount of 0.1 to 5 parts by mass based on 100 parts by mass of silver provides good breaking strength and adhesion strength.

REFERENCE SIGNS LIST

1 silicon substrate
  1*a* first main surface
  1*b* second main surface
  1*c* side surface
2 first semiconductor layer (p-type semiconductor region)
3 second semiconductor layer (n-type semiconductor region)
4 third semiconductor layer
5 antireflection layer
6 first electrode
7 second electrode
8 third electrode
  8*a* third power output electrode
  8*b* third collector electrode
9 passivation layer
10 solar cell device
  10*a* first main surface
  10*b* second main surface
  10*c* side surface

The invention claimed is:

1. A solar cell device comprising:
a substrate including a semiconductor region containing silicon in a main surface thereof;
a first electrode on the main surface, wherein the first electrode contains silver as a main proportion with respect to all components of the first electrode, wherein the first electrode contains elemental tin, and wherein the first electrode includes a through hole with tin deposited around the through hole; and
a second electrode connected to the first electrode on the main surface via the through hole, wherein the second electrode contains aluminum as a main proportion with respect to all components of the second electrode.

2. The solar cell device according to claim 1, wherein the elemental tin is present in the first electrode in an amount of 0.1 to 5 parts by mass based on 100 parts by mass of silver.

3. The solar cell device according to claim 1, wherein the second electrode has a larger average thickness than the first electrode.

4. The solar cell device according to claim 1, wherein the main surface comprises at least a region in which the second electrode is not formed, and the solar cell device further comprising a passivation layer on the main surface in the at least a region in which the second electrode is not formed.

* * * * *